United States Patent
Thomas et al.

(10) Patent No.: US 11,993,511 B2
(45) Date of Patent: May 28, 2024

(54) HERMETICALLY SEALED, TOUGHENED GLASS PACKAGE AND METHOD FOR PRODUCING SAME

(71) Applicant: Schott AG, Mainz (DE)

(72) Inventors: Jens Ulrich Thomas, Mainz (DE); Thomas Zetterer, Landshut (DE); Antti Määttänen, Tampere (SE); Robert Hettler, Kumhausen (DE); Yutaka Onezawa, Otsu (JP)

(73) Assignee: Schott AG, Mainz (DE)

( * ) Notice: Subject to any disclaimer, the term of this patent is extended or adjusted under 35 U.S.C. 154(b) by 75 days.

(21) Appl. No.: 17/648,007

(22) Filed: Jan. 14, 2022

(65) Prior Publication Data
US 2022/0135398 A1 May 5, 2022

Related U.S. Application Data

(63) Continuation of application No. PCT/EP2020/070172, filed on Jul. 16, 2020.

(30) Foreign Application Priority Data

Jul. 16, 2019 (DE) ..................... 10 2019 119 195.5

(51) Int. Cl.
*B81B 7/00* (2006.01)
*B81C 1/00* (2006.01)

(52) U.S. Cl.
CPC ........ *B81B 7/0058* (2013.01); *B81C 1/00333* (2013.01); *B81C 2203/0118* (2013.01); *B81C 2203/0163* (2013.01)

(58) Field of Classification Search
None
See application file for complete search history.

(56) References Cited

U.S. PATENT DOCUMENTS 6,661,084 B1 * 12/2003 Peterson ................. H01L 23/10
257/737
6,809,413 B1 * 10/2004 Peterson ................. H01L 23/10
257/737

(Continued)

FOREIGN PATENT DOCUMENTS

AU 2021223713 A1 * 9/2022 .......... B23K 26/206
DE 102 35 372 A1 2/2004

(Continued)

OTHER PUBLICATIONS

Notification of the Transmission of the International Search Report and Written Opinion of the International Search Authority or Declaration dated Oct. 29, 2020 for International Application No. PCT/EP2020/070172 (11 pages).

*Primary Examiner* — Michael Lebentritt
(74) *Attorney, Agent, or Firm* — Taylor IP, P.C.

(57) ABSTRACT

A hermetically sealed package includes: a base substrate and a cover substrate which define at least part of the package, the base substrate and the cover substrate being hermetically sealed to one another by at least one laser bonding line, the at least one laser bonding line having a height perpendicular to its bonding plane, at least the cover substrate including a toughened layer at its surface, at least on a side opposite the at least one laser bonding line; and at least one functional area enclosed in the package.

21 Claims, 9 Drawing Sheets

(56) References Cited

U.S. PATENT DOCUMENTS

| | | | |
|---|---|---|---|
| 6,896,949 B1* | 5/2005 | Scobey | G01J 3/26 |
| | | | 359/260 |
| 9,913,370 B2* | 3/2018 | Busby | H05K 5/0208 |
| 10,364,144 B2* | 7/2019 | Herbsommer | H03L 7/26 |
| 2006/0191215 A1* | 8/2006 | Stark | E06B 3/66342 |
| | | | 52/204.6 |
| 2012/0147538 A1 | 6/2012 | Kawanami et al. | |
| 2013/0291598 A1 | 11/2013 | Saito et al. | |
| 2016/0002103 A1 | 1/2016 | Wang et al. | |
| 2016/0357294 A1 | 12/2016 | Ozeki et al. | |
| 2017/0285328 A1 | 10/2017 | Shinohara | |
| 2019/0074476 A1 | 3/2019 | Dabich, II et al. | |

FOREIGN PATENT DOCUMENTS

| | | | | |
|---|---|---|---|---|
| EP | 3 012 059 A2 | 4/2016 | | |
| JP | 2014-201452 A | 10/2014 | | |
| WO | WO-2014058748 A1 * | 4/2014 | | C03C 15/00 |
| WO | WO-2015164241 A1 * | 10/2015 | | B23K 26/0869 |
| WO | WO-2020210070 A1 * | 10/2020 | | |

\* cited by examiner

| A | Aligning the wafers and the components to be accommodated |
| B | Superimposed wafer stack |
| C | Laser welding the accommodation cavities |
| D | Separating the wafer / dicing the packages |
| E | Chemically toughening the packages |
| F | Hermetically sealed, chemically toughened package |

HERMETICALLY SEALED, TOUGHENED GLASS PACKAGE AND METHOD FOR PRODUCING SAME

CROSS REFERENCE TO RELATED APPLICATIONS

This is a continuation application of International Patent Application No. PCT/EP2020/070172 filed on Jul. 16, 2020, which is incorporated in its entirety herein by reference. International Patent Application No. PCT/EP2020/070172 claims priority to German Patent Application No. DE 10 2019 119 195.5 filed on Jul. 16, 2019, which is incorporated in its entirety herein by reference.

BACKGROUND OF THE INVENTION

1. Field of the Invention

The invention relates to a transparent cover layer for a package, to a transparent package, and to a method for providing a plurality of hermetically sealed packages.

2. Description of the Related Art

Hermetically sealed packages, which may also be referred to as housings, encapsulations, or enclosures, can be used to protect sensitive electronics, circuits or, sensors, for example. They allow application of medical implants, for example, in the area of the heart, in the retina, or for bio-processors. Hitherto, packages made of titanium have been produced and used for these purposes.

Sensors can be protected against particularly adverse environmental conditions by a package. This field also includes MEMSs (micro-electromechanical systems), barometers, and the like, for example.

Other fields of use for a package according to the invention include a smartphone cover, the area of virtual reality glasses, and similar devices.

The aforementioned applications have in common that the electronics are subject to high requirements with regard to their robustness. Therefore, the electronics have to be protected against environmental influences. Furthermore, there may be the requirement of ensuring optical communication with the interior of the package, i.e. with the cavity defined by the package, that is the package has to be transparent, at least partially.

In principle, it has been known to join a plurality of parts and to arrange these parts such that an accommodation area is created in an intermediate space, which can accommodate components. For example, European patent EP 3 012 059 B1 discloses a method for producing a transparent piece for protecting an optical component. A novel laser process is used for this purpose.

What is needed in the art is a way to improve packages and, in particular, make them more resistant, which allows increasing the robustness against environmental impacts and also mechanical stress, for example.

SUMMARY OF THE INVENTION

In some exemplary embodiments provided according to the present invention, a hermetically sealed package includes: a base substrate and a cover substrate which define at least part of the package, the base substrate and the cover substrate being hermetically sealed to one another by at least one laser bonding line, the at least one laser bonding line having a height (HL) perpendicular to its bonding plane, at least the cover substrate including a toughened layer at its surface, at least on a side opposite the at least one laser bonding line; and at least one functional area enclosed in the package.

In some exemplary embodiments provided according to the present invention, a method for providing a plurality of hermetically sealed packages is provided. Each package provides a functional area. The method includes: providing at least two substrates, the at least two substrates includes a cover substrate and a base substrate, at least the cover substrate including transparent material at least in sections thereof, the at least two substrates being arranged so as to directly adjoin or be on top of one another; hermetically sealing the functional area by bonding the at least two substrates to one another along a bonding line by a laser welding process; dicing a respective package by cutting or separation; and chemically toughening a surface of a respective package by bathing it in a chemical solution.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIGS. 4A-8B are sectional views along lines A-B and C-D, respectively, of embodiments of a package as shown in FIG. 3;

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Exemplary embodiments provided according to the invention are based on the object of providing an improved package for a cavity to withstand even more adverse environmental conditions and impacts. Particular attention is paid to the mechanical stress on the package, for example to avoid fractures at the edges.

Another aspect of the present invention consists in providing the enhancement of the package in a particularly cost-effective, but also reliable and durable way, since the enhanced package also has to assert itself in the competitive situation on the market.

Therefore, in some embodiments provided according to the invention, a method is presented for providing a plurality of hermetically sealed packages. Although the method could be modified without difficulty so as to produce only a single package by this method, it makes sense under economic considerations to produce a plurality of packages in one and the same process sequence, since this saves time, effort, and raw material.

According to the invention, a hermetically sealed package is provided, the package at least comprising a base substrate and a cover substrate which define at least part of the package. In other words, the cover substrate is placed on the base substrate so as to make surface contact, for example, so that the base substrate and the cover substrate form a stack. In some embodiments, this may be a wafer stack.

The package encloses at least one functional area which may be adapted to perform various tasks. For example, the functional area may include an active surface. The functional area may comprise a cavity, that is to say a hollow space which is enclosed in the package. The cavity may be adapted for the installation or accommodation of functional components, so that it is an accommodation cavity.

At least the cover substrate may comprise a vitreous, i.e. glassy, material at least in some portions thereof. In some embodiments, the vitreous material of the cover substrate is at least partially transparent, that is at least for a particular range of wavelengths. In some embodiments, the cover substrate consists of a glass which is transparent in a wavelength range from 350 nm to 1800 nm. In addition, the cover glass has an anti-reflective coating, also known as AR coating, on both sides thereof, which reduces Fresnel reflection in the range from 1000 nm to 1100 nm from 5% to less than 1%. The majority of glasses exhibit high transmittance in this wavelength range. What is decisive for the final transmittance are coatings that are applied later and which can be customized to provide the respective properties.

The base substrate and the cover substrate are hermetically sealed to one another by at least one laser bonding line. Thus, the base substrate can be joined immediately and directly to the cover substrate in a hermetically sealed manner by a laser bonding line.

The laser bonding line has a height HL perpendicular to its bonding plane. In other words, the laser bonding line can be understood as a continuous fusing line with a mostly elliptical cross section (height HL+AF up to 100 μm, width 10-20 μm), which is caused by heat accumulation in a kind of bead string by laser injections. Generally, the fusing line is created above the laser injection bead string. The location of the laser injection bead string AF is below the bonding or welding plane, so that the cross section of the resulting fusing zone extends across the bonding plane. Therefore, the fusing line has a certain extent. In the present example, the vertical distance from the bonding plane to the end of the fusing zone of the laser bonding line in one direction is referred to as HL. Lasers with a high repetition rate may be employed for the laser welding. The bead string of laser injections is usually not visible anymore, and the spacing of the beads only has an indirect influence (heat accumulation) on the geometry of the fusing line.

At least the cover substrate comprises a toughened layer at its surface, at least on the side opposite the laser bonding line, for example a chemically toughened layer, and the toughened layer may exert compressive stress on the cover substrate.

In other words, for providing a package, a first step comprises to provide a first (base substrate) and at least a second substrate (cover substrate), and the at least one second substrate is made of transparent material, i.e. it is transparent for at least one range of wavelengths at least partially or in sections thereof. The at least two substrates are placed so as to directly adjoin each other or on top of one another, such that the cavity to be sealed is covered by the at least one second substrate and the respective bottom of the respective package is defined by the first substrate. The at least two substrates define at least one contact area therebetween, so that each package has at least one contact surface. The cavities are then hermetically sealed by welding the at least two substrates along the contact surface(s) of each package, in particular in the contact area along a line peripheral to each respective package. The packages can be manufactured jointly, for example from a common starting substrate, for example in the form of wafers of a wafer stack. The method subsequently includes the dicing of the respective package by a cutting or separation step.

The substrate layers are stacked directly, i.e. in direct contact to one another, that is to say they are arranged on top of each other. Foreign materials are excluded as far as possible between the substrate layers, so that the most cohesive surface contact possible is created between one substrate layer and the adjoining substrate layer. In the case of two substrates, for example, the base substrate is arranged in direct contact to the cover substrate, in particular without any other materials or any spacing between the base substrate and the cover substrate. For example, a resulting spacing of less than 5 μm, less than 2 μm, or less than 1 μm can be tolerable between the substrate layers, which may be caused by unevenness of the substrates.

In the example of more than two substrates, the base substrate is arranged directly adjoining the one or the first one of intermediate substrate layer(s), and the cover substrate in turn is arranged directly adjoining the one or the last one of intermediate substrate layer(s).

Then, the substrates are joined together using the novel laser welding process. In this case, a planar substrate layer is directly joined or bonded to the immediately adjoining planar substrate layer without providing or requiring any foreign material or non-planar material or intermediate material layers for this purpose. That is, the substrates are bonded directly to one another. The laser bonding line introduced into the two-dimensional contact area between two substrate layers bonds the directly adjoining substrate layers to one another in a non-releasable manner. The fused zone of the laser bonding line is therefore present in both substrates and seamlessly extends from the first substrate into the immediately adjoining second substrate, that is, for example, from the base substrate into the cover substrate.

Thus, a direct two-dimensional or even full-surface transition is formed from one substrate layer to the next substrate layer, i.e. a substrate-to-substrate transition or a glass-to-glass transition, for example. A locally limited volume in the form of a welding zone or laser bonding line is created, which includes material transferred or mixed between the adjoining substrate layers which in particular have a sheet-like shape. In other words, material of the first substrate, for example the cover substrate, penetrates into the adjoining substrate, for example the intermediate substrate or the base substrate, and vice versa, i.e. material from the adjoining substrate penetrates into the first substrate, so that the welding zone includes a complete mixture of material from the adjoining substrates. The welding zone can therefore also be referred to as a convection zone.

The novel laser welding technique for producing the non-releasable substrate-to-substrate transition may be particularly advantageously free of intermediate layers, glass frits, foils, or adhesives that had to be introduced between the substrates in previous prior art processes. Rather, the non-releasable bond can be produced without such interfering intermediate layers or additional materials. This saves the use of additional materials, increases the achievable strength of the end product, and enables reliable hermetic sealing of the functional area or the cavity(s). The laser welding zone can be identified in the finished end product, for example by the specific local change in the refractive index of the material in the small fusion area.

In the package, the base substrate and the cover substrate may be joined to one another in a hermetically sealed manner by the same laser bonding line. On the other hand, one or more intermediate substrates may be sandwiched between the base substrate and the cover substrate, and in this case the base substrate will be joined to the lowermost intermediate substrate and the cover substrate to the uppermost intermediate substrate.

The at least one laser bonding line can enclose the functional area, for example, at a distance DF therefrom. The laser bonding line may also be drawn into the material or into the contact area between two substrates in the form of a curved line, e.g. in an S-shape, so that optionally it is partially written into the toughened area or toughened zone of the toughened material. It has surprisingly been found that the welding of the material by the laser welding process also works when there is a high tensile stress that has been built up in the material as a result of the toughening.

The toughened layer may have a depth of layer, DoL. The cover substrate can have a minimum material thickness, MM, above the laser bonding line and up to the toughened layer. With a total thickness DA of the cover substrate, the following can moreover hold true: DA−HL−DoL≥MM. That is, the total thickness DA minus the height of the laser bonding line which extends into the cover substrate over HL and further minus the depth of layer DoL gives at least the minimum material thickness MM remaining of the cover substrate. The distance MM ensures that there will be no thermal annihilation of the toughened area.

The depth of layer DoL is the depth at which the stress curve passes through zero stress. Surprisingly, the welding lines may even be in the DoL of the cover glass without affecting strength. This is due to the small achievable lateral extent of the laser welding line in a range of less than 50 µm, for example 10 to 50 µm, or 10 to 20 µm. The welding line may protrude into the toughened surface, since it may only "soften", i.e. undo the toughening, in an insignificant area there. In other words, the laser welding line may form part of the toughened surface if it is adapted or adjusted so as to only have a small lateral extent.

However, to be on the safe side, a minimum material thickness MM can be provided above the laser bonding line, which separates the laser bonding line from the toughened surface. The minimum material thickness may be greater than or equal to 100 µm, greater than or equal to 50 µm, or greater than or equal to 20 µm. On the other hand, it has been found that it is sufficient if the minimum material thickness MM above the laser bonding line is less than 200 µm, for example less than 100 µm or less than 50 µm.

The cover substrate may be toughened on both sides thereof, so that the cover substrate has a second toughened layer with the depth of layer DoLb on its side facing the functional area and/or at the interface to the base substrate.

The height HL of the laser bonding line can be greater than the depth of layer DoLb of the second toughened layer.

At least the cover substrate may be toughened all around, that is to say in particular all around its entire outer surface. In other words, the cover substrate has a toughened layer or toughened layers on all of its sides surrounding the functional area, in particular completely surrounding the functional area. In this case, the package has been toughened subsequently.

In this case, the toughened layer can then have the depth of layer DoLa, the second toughened layer can have the depth of layer DoLb, and the third toughened layer can have a depth of layer DoLc along a circumferential edge of the package. In some embodiments, the thicknesses DoLa, DoLb, and DoLc can be the same.

Laterally of the functional area, the lateral minimum distance DB between the laser bonding line and the depth of layer DoLa may range from 5 to 10 µm, for example. Since this transition should not be de-toughened, so to speak, it may be advantageous if at least half of the modular width is retained laterally of the respective toughened edge. Since the laser bonding line may be higher, for example it may have an HL of 100 µm or less, the ratio of weld area to edge area is less favorable. It is therefore better to not let the laser bonding line protrude into the toughened zone in the first place.

The cover substrate may comprise the one or a further functional area. In other words, the functional area may be provided in the cover substrate. For example, the functional area may comprise an active area applied to the underside or lower surface of the cover substrate, such as a reflective layer, for example. The functional area may, for example, be recessed in the cover substrate by producing a recess in the cover substrate using a suitable process. A sandblasting process can be suitable for this purpose.

The base substrate may also have a toughened layer DoLd on its underside or lower surface opposite the laser bonding line.

Each package may define one cavity which is enclosed by a laterally circumferential edge, a bottom and an upper side of the package. In other words, such a cavity is enclosed all around by the package, so that the package defines the circumferential edge, the bottom and the top for the cavity.

The cavities may in particular be formed as accommodation cavities. This means that, for example, electronic circuits, sensors, or MEMSs may be introduced into the respective cavities, i.e. can be accommodated therein. These aforementioned devices such as in particular electronic circuits, sensors, or MEMSs will therefore be completely enclosed all around by the package, since they are disposed inside the accommodation cavity.

The method provided according to the invention comprises to initially provide at least two substrates, i.e., for example, a cover substrate and a base substrate, and at least one of the two substrates is made of transparent material or at least comprises a transparent material in sections thereof. The at least two substrates are arranged directly adjoining each other or directly on top of each other. In other words, the at least two substrates are arranged or attached to one another in such a way that their faces contact each other without other layers being present between the at least two substrates.

For technical reasons, there might be minor gas inclusions between the substrate layers, which cannot be avoided and which may be a result of possible unevenness of the substrate layers. The amount of trapped gas can be further reduced by increasing the pressure, for example, such as in particular by pressing the at least two substrates against each other, or by a surface treatment of the substrate layers such as a grinding process. In some embodiments, the gap that might arise between the substrates has a width of less than or equal to 5 µm, less than or equal to 2 µm, or less than or equal to 1 µm. Such a gap arises, for example, due to tolerances in the substrate manufacturing, by thermal impacts or by inclusions of particles such as dust. Even with such a tolerable spacing which is still considered to be immediately adjoining in the context of the present invention, it is possible to laser weld in a manner so that the welding zone is between 10 to 50 µm in thickness so that a hermetic seal is ensured. Again, in this case, the welding zone extends from the first substrate into the second substrate adjoining the first substrate. Thus, the welding zone is introduced in the contact area between the first and second substrates and directly fuses the substrates to one another to form an inseparable bond. In other words, when the adjoining substrates are bonded in the welding zone, material of both substrates is directly melted in the welding zone, and the material of the first substrate mixes with the material of the second substrate to form an inseparable integral bond. The package produced in this way therefore comprises an integral, i.e. monolithic bond between the substrates in the welding zone.

The at least one transparent substrate defines the respective lateral edge or edge and the respective upper side of the respective package of the cavities to be sealed. In some embodiments, the at least one transparent substrate comprises two transparent substrates in close contact to one another such that the first transparent substrate defines the edge and the second transparent substrate defines the upper side or top of the respective cavities. In some embodiments, the transparent substrate has a recess or hollow. The recess or hollow may be produced in the transparent substrate by an abrasive process, for example, or by another subtractive process such as an etching process. The second substrate defines the respective bottom of the respective package.

In some embodiments, all three substrate layers are transparent, such that the bottom, the lateral edge and the top, i.e. the complete package, is entirely made of transparent material.

The step of hermetically sealing the cavities may be performed by welding together the at least two substrates along the respective contact area or interface of each package using a laser welding process. In other words, a laser can be used to deposit energy in the contact area or in the desired penetration depth, specifically locally, such that it can be referred to as a cold welding process. That means, the thermal energy provided for the welding is focused to the extension of the interface and diffuses only slowly into the rest of the material of the package, so that in particular no significant temperature rise will occur in the cavity. This protects the electronics disposed in the cavity from overheating.

For this purpose, the laser locally melts material of the two substrates in the area of the respective package along the contact surface, so that the at least two substrates are bonded locally. For this purpose, the person skilled in the art may refer to EP 3 012 059 B1, for example, which is hereby incorporated by reference.

The respective package is singulated, i.e. diced by a cutting or separating step. This means that the substrates are cut or separated such that each package is separated from the rest of the material.

The packages are finally chemically toughened at their surface by bathing them in a chemical solution.

It has been found that the chemical toughening of the surface by bathing in a chemical solution allows significantly increasing the resistance to breakage of the respective package and, as a result, in particular edge breakage is reduced. This is surprising for several reasons.

First of all, it is surprising that the chemical solution does not penetrate as far as to the welding seams so that the welding seams are not chemically stressed. This could have detrimental effects and initially had to be assumed. Hitherto, it was believed that chemically toughened packages were not technically feasible using a method in which two or more substrates are welded together, since the packages were expected to break upon separation of the packages from the substrate. This was also found in initial experiments. However, surprisingly, this has now become possible with the method presented here, and may be in conjunction with the use of a laser for the welding and/or the separating step.

Furthermore, it has surprisingly been found that the cavity sealed by laser welding can easily withstand internal pressures of 2 atm and more, such as might occur when the package heats up in the toughening bath, for example.

The package may comprise a first and a second transparent substrate, the first transparent substrate defining the respective edge and the second transparent substrate defining the respective upper side or top of the cavities. In other words, the first transparent substrate is the cover substrate and the second transparent substrate is the intermediate substrate. When two transparent substrates are used, one to form the edge and a second one to form the upper sides, two circumferential optically transparent areas are already associated with each package. In this case, the respective cavity is hermetically sealed using the laser welding process to weld along the two interfaces, on the one hand between the cover substrate and the intermediate substrate, and on the other hand between the intermediate substrate and the base substrate. Thereby, the first and second transparent substrates as well as the base substrate are firmly welded together, and at the same time the cavities are hermetically sealed.

The at least two, for example three, substrates may be provided in the form of a wafer stack comprising at least two, for example three, wafers. Then, a plurality of hermetically sealed packages can be jointly produced from the wafers or the wafer stack in one and the same fabrication process. This procedure has proven to be particularly cost-efficient, since it implies particularly little scrap and thus material loss.

The at least two wafers may be made of glass or at least one wafer is made of glass and the second wafer is made of a material different from glass. In other words, the wafer which defines the bottom of the cavities may be made of an optically non-transparent material that may have other properties such as, in particular, electrical conductivity. However, the lateral edge and the upper side of the packages are made of transparent material. In some embodiments, all substrates are provided from transparent material. A potential advantage of a transparent package made of glass or predominantly made of glass, in particular boro silicate glass, is its chemical inertness.

The strength of the edge of the hermetically sealed package can be measured using a four-point bending test procedure. The edge strength of the packages enhanced by the method of the invention is at least 150 MPa or even more than 150 MPa, so that they are particularly resistant.

The dicing of the respective package may be achieved using a laser, i.e. by a laser cutting or laser separation process. This allows for a cleaner separation of the packages from one another, with fewer breakage and cleaner separation points. The same laser that is used for the welding step can also be used for the separation.

Besides glass, the at least one transparent substrate may also be made of glass ceramics or silicon or sapphire or a combination of the aforementioned materials, i.e., for example, of glass/silicon, a glass/silicon/sapphire combination, or a silicon/sapphire combination.

The one or more substrate(s) may also have a coating. For example, AR coatings may be applied, or protective coatings, bioactive films, optical filters, conductive layers such as those made of ITO or gold, for example, as long as it is ensured that transparency or at least partial transparency for the employed laser wavelength is provided in the irradiation area of the laser.

The step of chemically toughening the packages may comprise at least one of the following sub-steps: providing an acidic or basic solution, in particular comprising or consisting of $KNO_3$; introducing the packages into the acidic or basic solution; heating the acidic or basic solution to a temperature of at least 650 Kelvin, at least 700 Kelvin, or at least 720 Kelvin; bathing the packages in the acidic or basic solution for at least 6 hours, for at least 8 hours, or for at least 9 hours, and, for example, for not more than 12 hours.

The acidic or basic solution may also comprise other potassium salts. Replacing the sodium ions by rubidium, cesium, francium, or the like is also possible, in principle. During toughening, care should be taken to prevent the package as best as possible from touching the trough, for example, or the racks that are employed, or other items in the bath, since the effect of the toughening bath might be reduced at respective contact points.

The invention furthermore provides a package comprising a hermetically sealed accommodation cavity enclosed therein, which has been produced according to any of the methods described previously.

A package produced according to the method described previously may be used as a medical implant or as a sensor, in particular as a barometer.

Also within the scope of the invention is an in particular transparent package comprising a hermetically sealed accommodation cavity for accommodating an accommodation item. An accommodation item is an electronic circuit, a sensor or an MEMS, for example.

The package provided according to the invention has a lateral circumferential edge made of transparent material, as well as a bottom and an upper side which jointly completely enclose the accommodation cavity.

In this case, at least one of the lateral circumferential edge, the bottom, or the upper side are transparent for a range of wavelengths, at least in sections thereof. In other words, it is sufficient if at least one component of the package is transparent for a wavelength range at least in a portion of the component, and if the wavelength range is known in advance and the material can accordingly be adapted to the wavelength of the laser to be used, if desired.

The package is welded using a laser welding process to form the hermetically sealed package. In other words, the edge, bottom, and top consist of more than one piece, for example of two or three parts or even more, and the parts are laser-welded to one another to complete the package.

The package has been chemically toughened at least partially and/or in sections thereof. For example, one surface of the package is chemically toughened, i.e. for example the upper side. It is also possible that the upper side and the edge are chemically toughened. In some embodiments, the upper side and the edge and the lower side are chemically toughened, so that the respective surface of both the upper side and the lower side as well as the respective edge, i.e. the rim, is chemically toughened.

The lateral circumferential edge may be made from a first substrate, the bottom may be made from a second substrate, and the top may be made from a third substrate. In this case, again, the package will be made from a wafer stack.

In the case of the transparent package, the lateral circumferential edge and/or the bottom and/or the upper side can be chemically toughened, or the entire surface of the package is chemically toughened.

The chemical toughening of the package may be implemented by partially or completely exchanging sodium ions over a layer thickness of 30 μm or less, or 20 μm or less, or 10 μm, by potassium ions.

In some embodiments, the package is subjected to chemical toughening after it has been separated from further packages which were produced in a fabrication process together with this package, for example, in particular in the fabrication process as described previously.

The package may comprise a lateral circumferential edge made of transparent material made from a first part, a bottom made from a second part, and an upper side made from a third part, which together completely enclose the accommodation cavity.

The aforementioned at least three parts of the package are then joined together using a laser welding process to form the hermetically sealed package.

The casing may exhibit an edge strength of at least 150 MPa or of more than 150 MPa, and this edge strength can be measured using a four-point bending test technique.

The transparent package may, for example, have a size of 3 mm×3 mm or less, in particular the accommodation cavity has a diameter of less than or equal to 2 mm. For example, a transparent package may also have a size of 0.2 mm×0.2 mm or less. On the other hand, the transparent package may also be made larger, depending on the area of application, with several centimeters in length and more being possible. For practical reasons, governed by the fabrication method, which should however not be understood as a size limitation per se, a size limit is simply given by the size of the wafers to be cut. However, the use of wafers for the fabrication is considered to be only an example. For example, it is entirely possible to use glass sheets which can also have larger dimensions than typical wafer dimensions, for producing the transparent package.

Figures 1A, 1B:
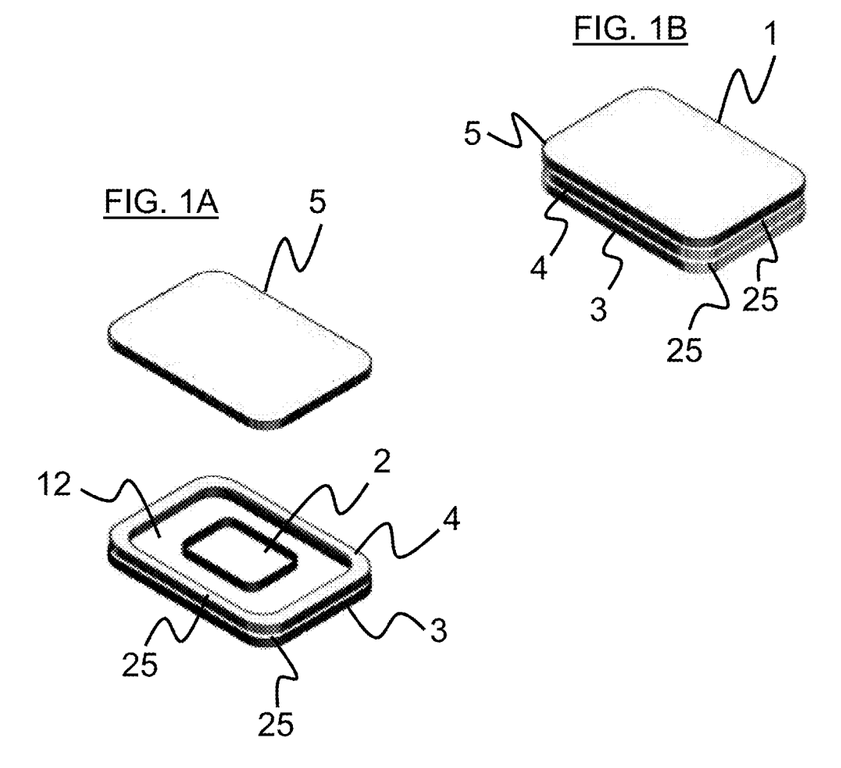
FIG. 1A is a view of the opened accommodation cavity from above.
FIG. 1B is a perspective view of a closed package.

Referring now to the drawings, FIG. 1A shows the accommodation item 2 to be protected, embedded on a base substrate or lower wafer 3, enclosed or surrounded along its lateral sides by an intermediate wafer 4, and covered by a cover substrate or upper wafer 5. In the example of FIG. 1A, the three wafers 3, 4, 5 thus jointly define the package 1 around the accommodated item 2 which is disposed in the cavity 12. In other words, when the upper wafer 5 is placed on the intermediate wafer 4 in the example of FIG. 1A, an accommodation cavity 12 is formed which is closed on all sides and which will have to be hermetically sealed in subsequent steps.

FIG. 1B shows the hermetically sealed, chemically toughened package 1 formed in this way. Like the example of FIG. 1A, this package 1 comprises the base substrate or lower wafer 3, the intermediate substrate or intermediate wafer 4, and the cover substrate or upper wafer 5 stacked on top of each other. A respective contact area or interface 25 exists between the lower wafer 3 and the intermediate wafer 4 on the one hand, and between the intermediate wafer 4 and the upper wafer 5 on the other hand. As can also be seen from FIG. 1A, the intermediate wafer layer 4 is not continuous, so that accommodation cavities 12 are defined at the level of the intermediate wafer layer 4.

Figure 2A:
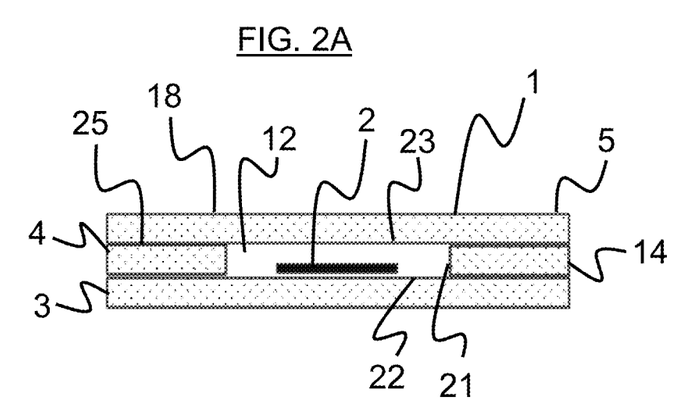
FIG. 2A is a sectional view through the package.

Referring now to FIG. 2A, which shows a sectional view through a hermetically sealed, chemically toughened package 1, a lower wafer 3 defines the bottom 22 of cavity 12, an intermediate wafer 4 defines the lateral side or edge 21 of cavity 12, and an upper wafer 5 finally defines the upper side 23 of cavity 12. In other words, the lower wafer, the intermediate wafer, and the upper wafer 3, 4, 5 in the form of a wafer stack 18 jointly enclose the accommodation cavity 12. The accommodated item 2 is disposed inside the accommodation cavity 12.

Figure 2B:
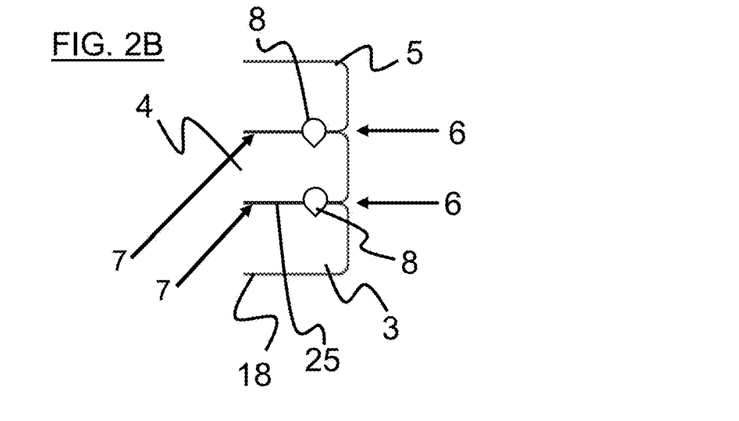
FIG. 2B shows a detail of the welding zone.

FIG. 2B shows a detail of the welding area, clearly depicting the laser-welded interface zone 7 and laser welding zone 8. The laser welding zone 8 is situated in the area of optical interface 25. The package 1 may be subjected to environmental impacts from outside the package, in particular at corners 6 of the laser-welded stack 18. Here, these corners 6 also prevent chemical solutions from penetrating into the wafer stack 18 as far as to the laser welding zone 8. In other words, surprisingly, there is no penetration of chemical solutions occurring at the corners 6 of the laser-welded stack 18.

Figure 3:
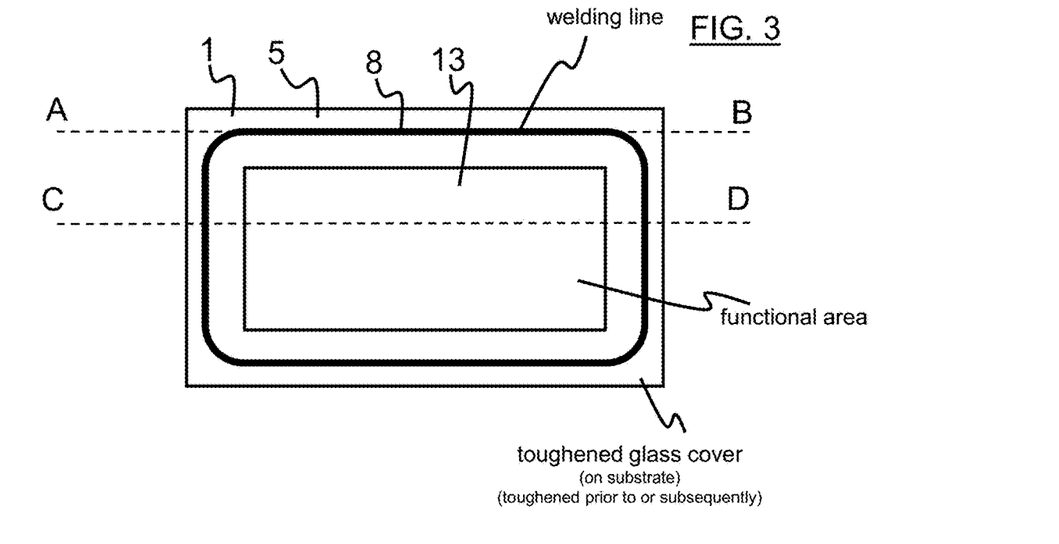
FIG. 3 is a plan view of a further embodiment of a package.

FIG. 3 shows a plan view of a package 1 provided according to the invention, with the circumferential laser welding zone 8 surrounding the functional area 13. Functional area 13 may be implemented in different ways. Examples of the embodiment of functional area 13 as well as for other options of a package will be apparent from FIGS. 4A through 8B. The various designs of functional area 13 can all be schematically illustrated as in FIG. 3, since they will be similar in such a plan view. Lines A-B and C-D indicate section lines along which the sectional views of FIGS. 4A to 8B have been reproduced.

The functional area can implement various tasks, for example it may include an optical receiver or a technical, electro-mechanical, and/or electronic component which is disposed in the functional area 13. It is also possible to implement a plurality of such tasks in the functional area 13. On the top, the package 1 is covered by the upper substrate 5. The laser welding zone 8 extends into this upper substrate 5.

Figure 4A:
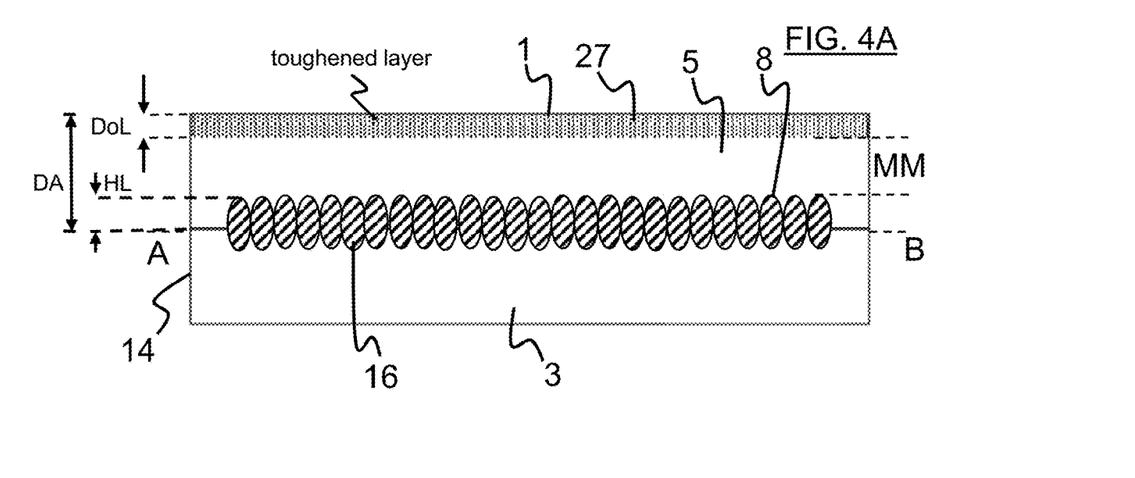

Referring to FIG. 4A which shows a first sectional view of an exemplary embodiment of a package 1, where the upper substrate 5 has a first toughened layer 27 at its upper surface. For example, the upper surface of cover substrate 5 can be dipped into a toughening bath (see e.g. FIG. 9) before being bonded to the base substrate 3 or else after having been bonded to the base substrate 3, so that the finished package 1 will be chemically toughened on one side, i.e. will have at least one toughened surface 27 and/or will have at least one toughened layer. In other words, the finished package 1 is toughened at least in sections thereof or at least partially, in particular chemically toughened. With the chemical toughening, compressive stress is created on the cover substrate 5.

FIG. 4A furthermore shows the structure of the laser welding line 8 as composed of a series or a string of multiple laser pulse impact areas 16 which are placed so close to one another that the materials of base substrate 3 and of cover substrate 5 seamlessly fuse to one another. The first toughened layer 27 has the height DoL. The welding zone 8 has the height HL. A minimum material thickness MM remains between toughening zone 27 and welding zone 8. The entire thickness of cover substrate 5 can then be added up of HL+MM+DoL.

Figure 4B:
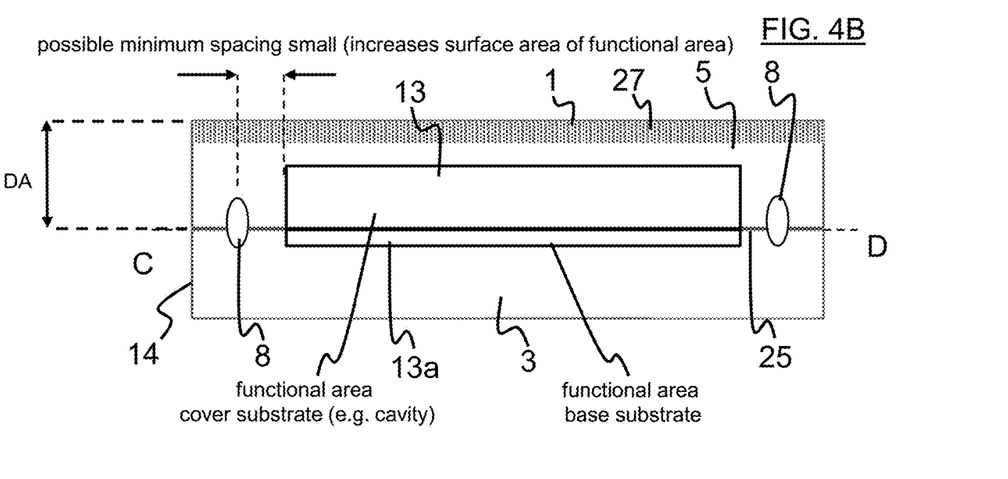

FIG. 4B shows a sectional view of an embodiment of a package 1 taken along line C-D as shown in FIG. 3. Cover substrate 5 has a first toughened layer 27 at its top or outer surface, which extends over a thickness DoL into the material of the cover substrate 5. In other words, cover substrate 5 and thus the package 1 is toughened at its upper surface, i.e. has a toughened zone 27 there, so that the package 1 is toughened in sections thereof, namely on one side.

FIG. 4B furthermore shows a section through the functional area 13, 13a which extends inside the package 1, for example as a continuous cavity or hollow space. In other words, the cavity extends from base substrate 3 into the cover substrate 5 and, for example, is in the form of a recess made in the base substrate 3 and/or in the cover substrate 5. For example, the functional area 13a may also comprise an active layer such as an electrically conductive layer, and the functional area 13 comprises the cavity. The laser welding zone 8 provided circumferentially around the functional area 13, 13a seals the functional area 13, 13a all around along the lateral sides thereof. It might be conceivable to leave gaps in the laser welding zone 8 so that the functional area 13, 13a will not be sealed all around, for example in order to leave open a communication channel which can be used to establish fluid communication with the environment, for example. In other words, it might be contemplated to not seal predefined locations or points using the focused laser beam 9, but to rather achieve hermetic seal by other means there, such as by an adhesive. In some embodiments, the functional area 13, 13a is sealed along all of its lateral sides and without any gaps.

Figure 5A:
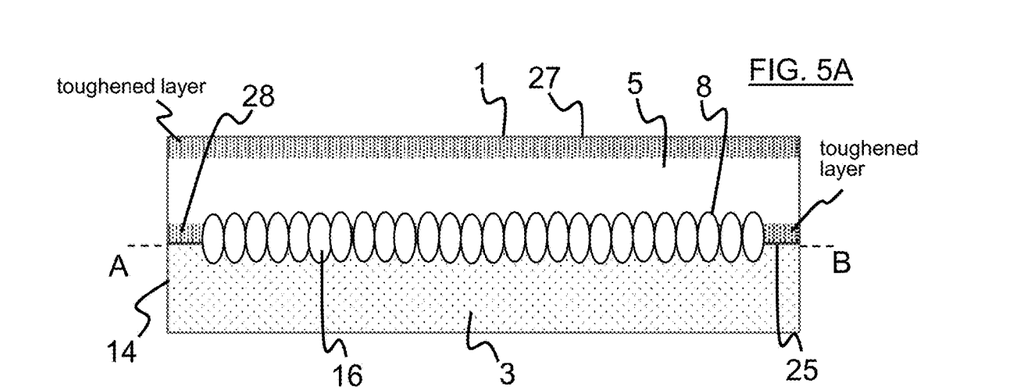

Referring to FIG. 5A which shows a further embodiment in which incident laser pulses 16 create the laser welding zone 8 where the cover substrate 5 is welded or joined to the base substrate 3 along contact area 25. In this embodiment, the cover substrate 5 has a first toughened layer 27 at its upper surface and a second toughened layer 28 at its lower surface or underside. In order to achieve this, the cover substrate 5 was first placed in a toughening solution without being in contact with other substrates, and was chemically toughened in this way on its two opposite faces. Thus, in this embodiment, the cover substrate 5 is welded directly in the area of a toughened layer 28. It is completely surprising that the welding within a toughened layer 28 is possible at all.

Figure 5B:
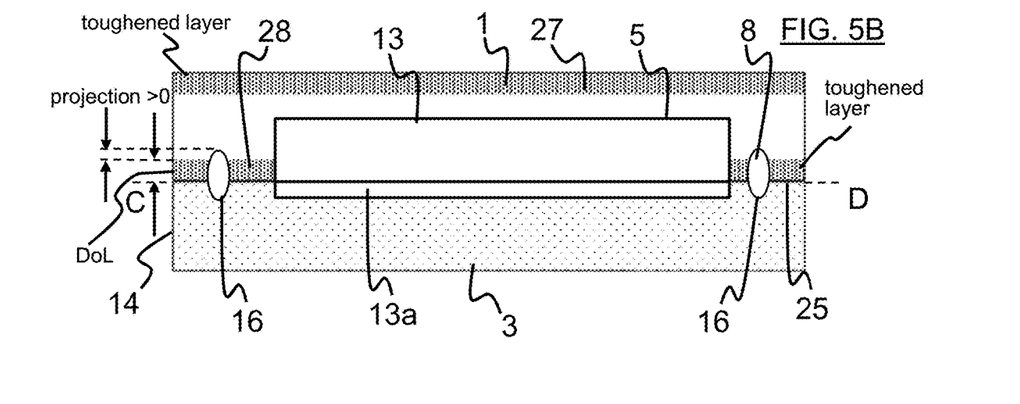

FIG. 5B shows the further embodiment of a package 1 in a sectional view along line C-D as indicated in FIG. 3. The package 1 comprises the first toughened layer 27 and the second toughened layer 28, both toughened layers introduced into or formed in the cover substrate 5. The functional area 13, 13a extends through the toughened layer 28, so that the toughened layer 28 is limited to a circumferential area around the functional area 13, 13a. The welding zone 8 is partially formed in the second toughened layer 28. Toughened layer 28 has a height DoLb. The individual laser pulse impact areas 16 and thus the welding zone 8 can be adjusted so as to have a height HL that extends beyond the second toughened zone 28. This allows to ensure that the welding joint penetrates into the non-toughened area of the material, so that the end of the welded area is no longer within the toughened area. The end of the welding zone 8 thus penetrates into the stress-free area of the material, i.e. in particular of the glass. In other words, the welding zone 8 protrudes from the second toughened layer 28, with the protrusion extending into the non-toughened material of the MM area.

Figure 6A:
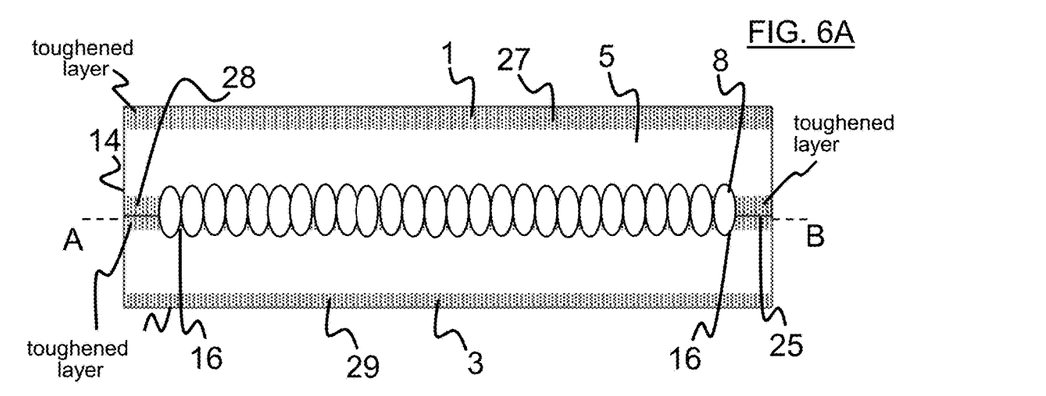

FIG. 6A shows a further example of a package 1 in which first toughened layer 27, second toughened layer 28 and third toughened layer 29 are provided. In this embodiment, the cover substrate 5 and also the base substrate 3 have been toughened on both of their major surfaces or faces, in particular chemically toughened in a toughening solution. In other words, substrates 3, 5 were individually immersed in a toughening solution to be chemically toughened along their respective major surfaces, i.e. at their upper and lower surfaces, to toughen the faces. Once toughened, the two substrates 3, 5 were arranged one on top of the other, i.e. stacked, so that the upper surface of base substrate 3 contacts the lower surface of cover substrate 5. The toughened zone provided at the upper surface of base substrate 3 thus comes into contact with the toughened zone provided at the lower surface of cover substrate 5. Subsequently, substrates 3, 5 are joined, i.e. welded directly in the area of the toughened material, i.e. in particular in the area of the toughened glass.

It is assumed that the laser welding process leads to relaxation in the material in the area of the respective laser pulse impact zone 16, so that if the height HL of the laser pulse impact zone exceeds the height of toughened zone 28 so that a protrusion remains, relaxed material will then be present contiguously from first substrate 3 across the area of the respective pulse impact zone 16 and into the second substrate 5. In the finished stack of package 1, the first toughened layer 27 will thus be provided on the upper side thereof, the second toughened layer 28 will be provided along contact area 25, and the third toughened layer 29 will be provided on the underside thereof.

Figure 6B:
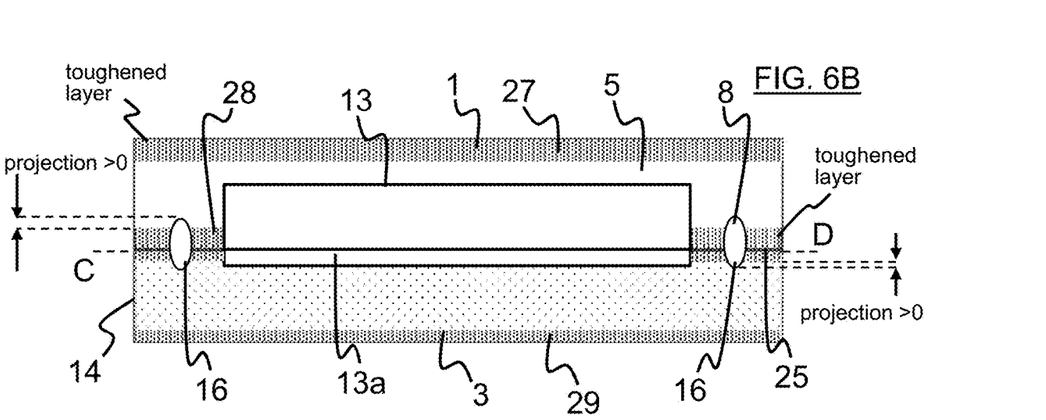

FIG. 6B shows the further embodiment that includes three toughened zones 27, 28, 29, in a sectional view taken along section line C-D. In this embodiment, again, the functional area 13, 13a is provided so as to extend from base substrate 3 and into the cover substrate 5, for example as a recess in the respective substrate. Such a recess 13, 13a may in particular be made using a sandblasting process. The welding line 8 is provided all around the recess 13, 13a, so that the recesses 13, 13a are hermetically sealed on all sides.

Figure 7A:
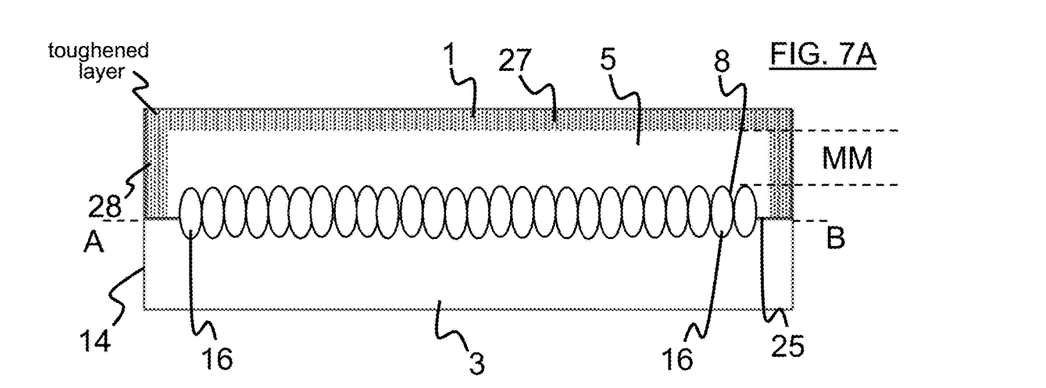

FIG. 7A shows yet another embodiment of a package 1 taken along section line A-B, and here the cover substrate 5 has the first toughened layer 27 at its upper surface and the second toughened layer 28 at its narrow surface or edge 14. For example, the cover substrate 5 was immersed into a toughening solution, individually or after having been joined to the base substrate 3, with the upper surface of cover substrate 5 immersed in a toughening solution for chemical toughening to such an extent that the height of the second toughened layer 28 is achieved. In the present example, the base substrate 3 does not have any toughened zones. In this example, the lateral toughened zone 28 terminates directly at the contact area 25 between cover substrate 5 and base substrate 3. The joint along welding line 8 was made inwards of the toughening zone 28, that means in relaxed material.

Figure 7B:
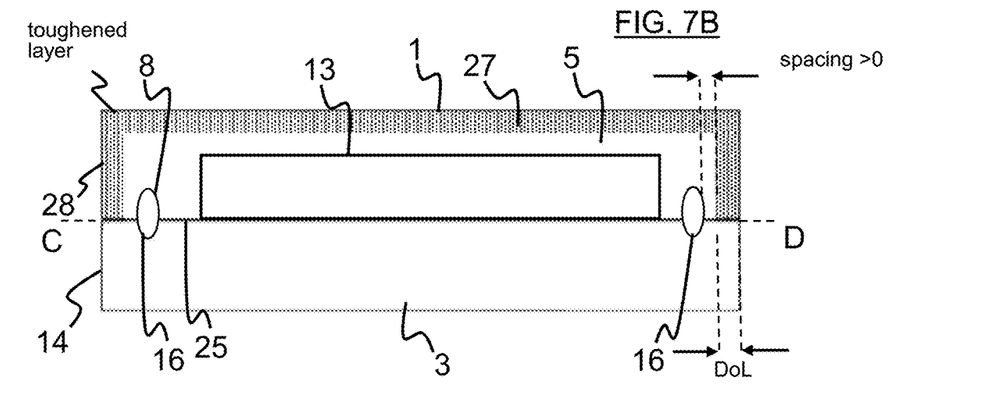

FIG. 7B shows yet another embodiment of a package 1 in which a first major surface has a toughened layer 27 and a first minor surface or edge 14 has a toughened layer 28 along a section thereof. The toughened layer 28 may extend circumferentially around the package 1, for example so as to continuously surround the functional area 13. The sectional view shown here is taken along line C-D as indicated in FIG. 3, that is cutting through functional area 13. In this embodiment, the functional area 13 is limited to the dimensions of cover substrate 5, so it does not extend into base substrate 3. The base substrate 3 is directly joined to the cover substrate 5, i.e. there is no further layer or no further substrate arranged between base substrate 3 and cover substrate 5. Functional area 13 is in the form of a cavity. The cavity may be introduced into the cover substrate 5 by a sandblasting process, for example, more generally by using an abrasive technique. Chemical etching is also possible for creating the cavity in the substrate.

Figure 8A:
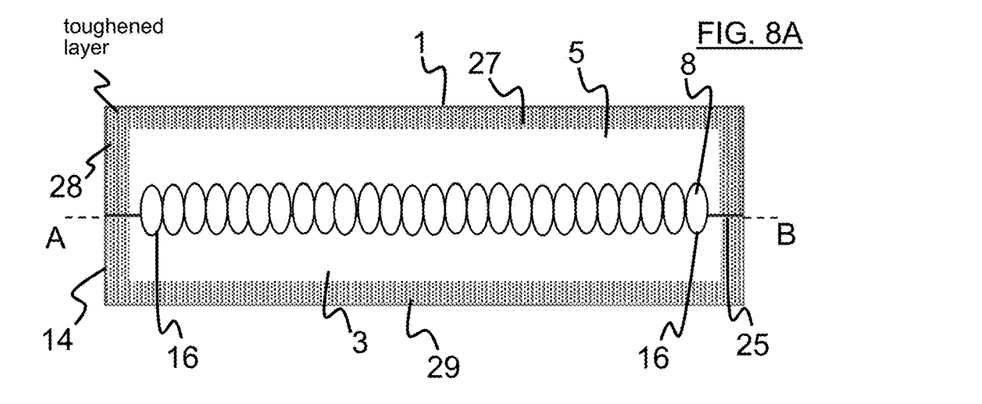

FIG. 8A shows yet another embodiment of a package 1, in a sectional view taken along line A-B as indicated in FIG. 3, i.e. a section along or through a welding line 8. In this embodiment, the package 1 is toughened on all outer sides, that is both the two opposite faces have toughened layers 27 and 29, and the circumferential edge 14 of the package has the toughened layer 28, with the circumferential edge 14 extending all around the package 1. In other words, in the case of a cuboid package, all four narrow sides that are found on a cuboid jointly form the edge 14. The edge 14 can also be understood or referred to as an edge 21 of the package, which extends around the cavity. A package 1 as shown in FIG. 8A can be obtained, for example, by immersing the welded package comprising the cover substrate 5 and the base substrate 3 in a toughening solution and in particular chemically toughening it there. The toughened layers 27, 28, 29 are thus disposed directly at the outer surfaces of the package 1. Thus, inwards of the toughened layers 27, 28, 29 there remains an area for the welding line 8, which is introduced with a spacing to the toughened layers 27, 28, 29, if possible.

Figure 8B:
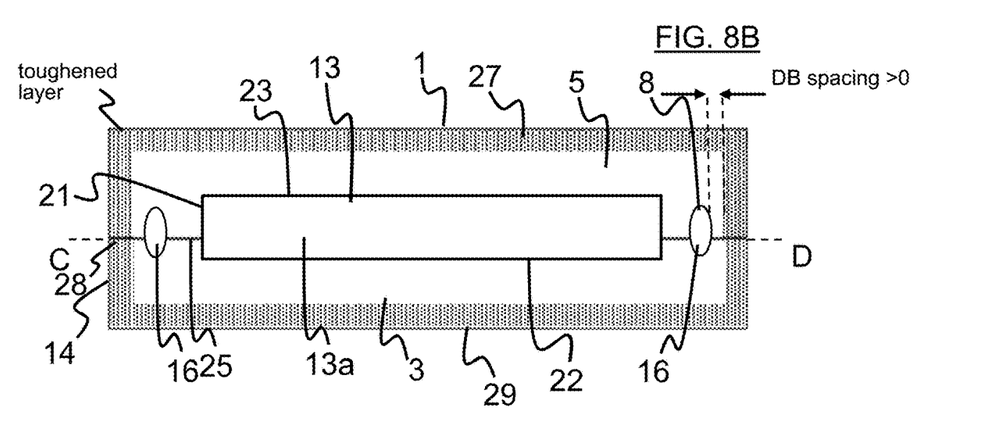

FIG. 8B shows an embodiment of the package 1 in a sectional view taken along line C-D. The package 1 is chemically toughened all around, in other words it has a toughened area 27, 28, 29 at the entire outer surface thereof. For example, a first toughened layer 27 is provided at the first major side which may be the upper surface of the cover substrate 5, a third toughened layer 29 is provided on a second major side which may be the lower surface of the base substrate 3, and the second toughened layer 28 is provided at the peripheral edge 21 or circumferential edge 14. The upper side 23 of the cavity is located inwards of the first toughened layer 27, the edge 21 of the cavity is located inwards of the second toughened layer 28, and the bottom 22 of the cavity is located inwards of the third toughened layer 29. Thus, the cavity or functional area 13, 13a is enclosed by toughened material 27, 28, 29 on all of its sides.

Figure 9:
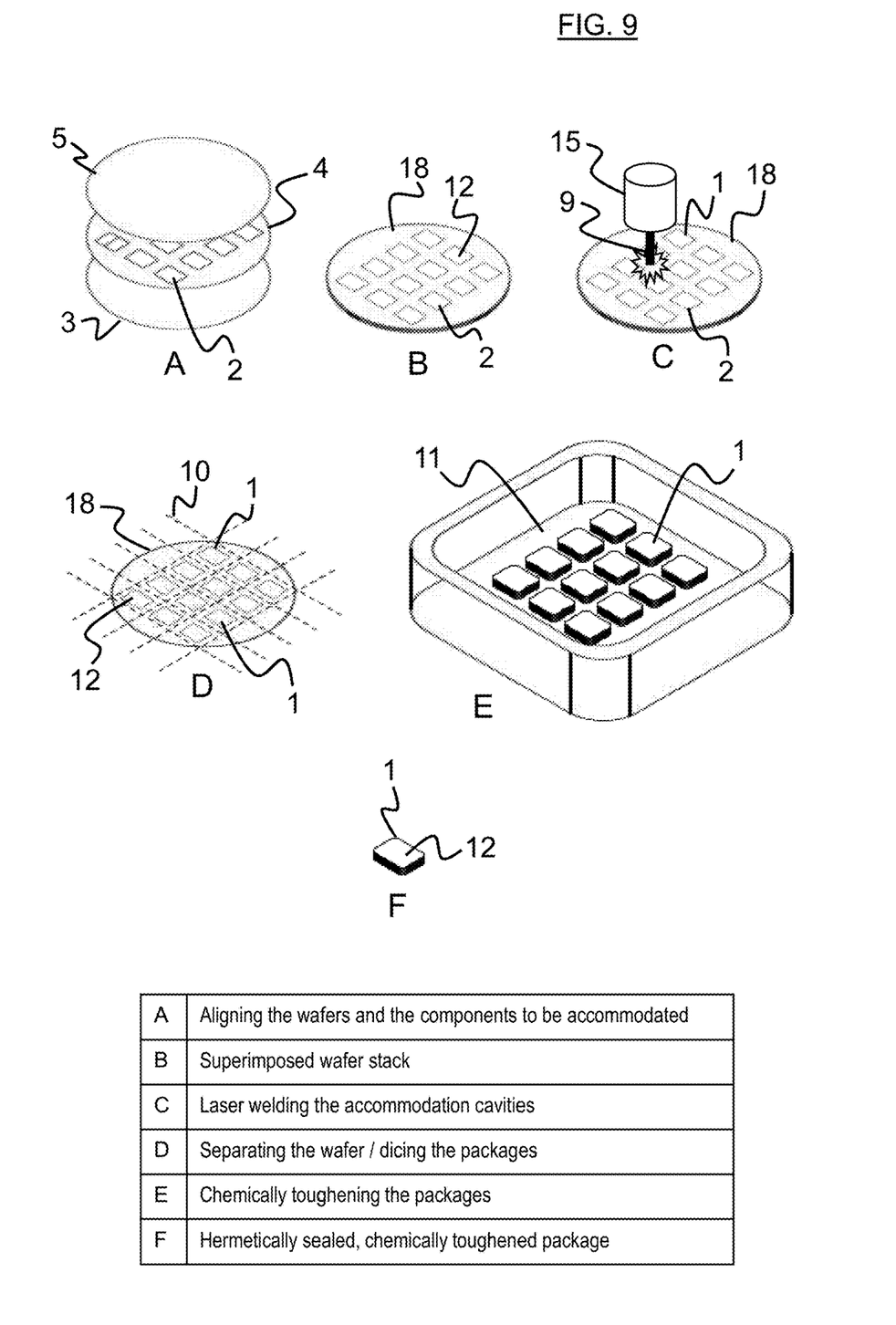
FIG. 9 illustrates method steps for producing a package.

Referring to FIG. 9 which shows an embodiment of the method for producing a package 1. In a step A, the wafers are aligned with the accommodation items 2 to be accommodated. The cover substrate or upper wafer 5 is placed on the intermediate wafer 4 which in turn is placed on the base substrate or lower wafer 3 such that a wafer stack 18 is created. Since the intermediate wafer 4 which includes the recesses which define the cavities 12 is arranged in a sandwiched relationship, the accommodation cavities 12 will then be enclosed by wafer material on all sides. In other words, aligning the wafers in step A creates the cavity 12 which is enclosed on all of its sides by edge 21, bottom 22, and upper side 23 of the cavity.

Step B of the method shown in FIG. 9 shows the stack of wafers 18 arranged one above the other, with cavities 12 provided inside for receiving accommodation items 2. In this closed form, this wafers stack 18 can be fed to the welding process.

Step C shows the laser welding of the respective accommodation cavities 12, that is the sealing of the cavities 12 on all sides along the contact areas 25. For this purpose, a laser unit 15 is guided over the surface of the wafer stack 18 from above the wafer stack 18 and a focused laser beam 9 is selectively directed into the zone to be joined. The laser welding lines 8 may, for example, be created in the form of a grid of intersecting lines. Drawing two or more laser welding lines 8 in parallel can also be implemented if this proves to be advantageous for later dicing, for example, depending on the material. Once, step C of the manufacturing process has been completed, all of the cavities 12 are hermetically sealed.

Step D shows the step of separating or cutting the wafer stack 18 for dicing the packages 1. Here, the wafer stack is cut or separated along cutting or separation lines 10.

In a step E, the packages 1 are chemically toughened in a bath 11 comprising an acidic or basic toughening solution. The bath 11 may include temperature control so that a preset temperature can be maintained.

Step F finally shows the hermetically sealed, chemically toughened package 1 with the accommodation cavity 12 provided therein.

Figure 10:
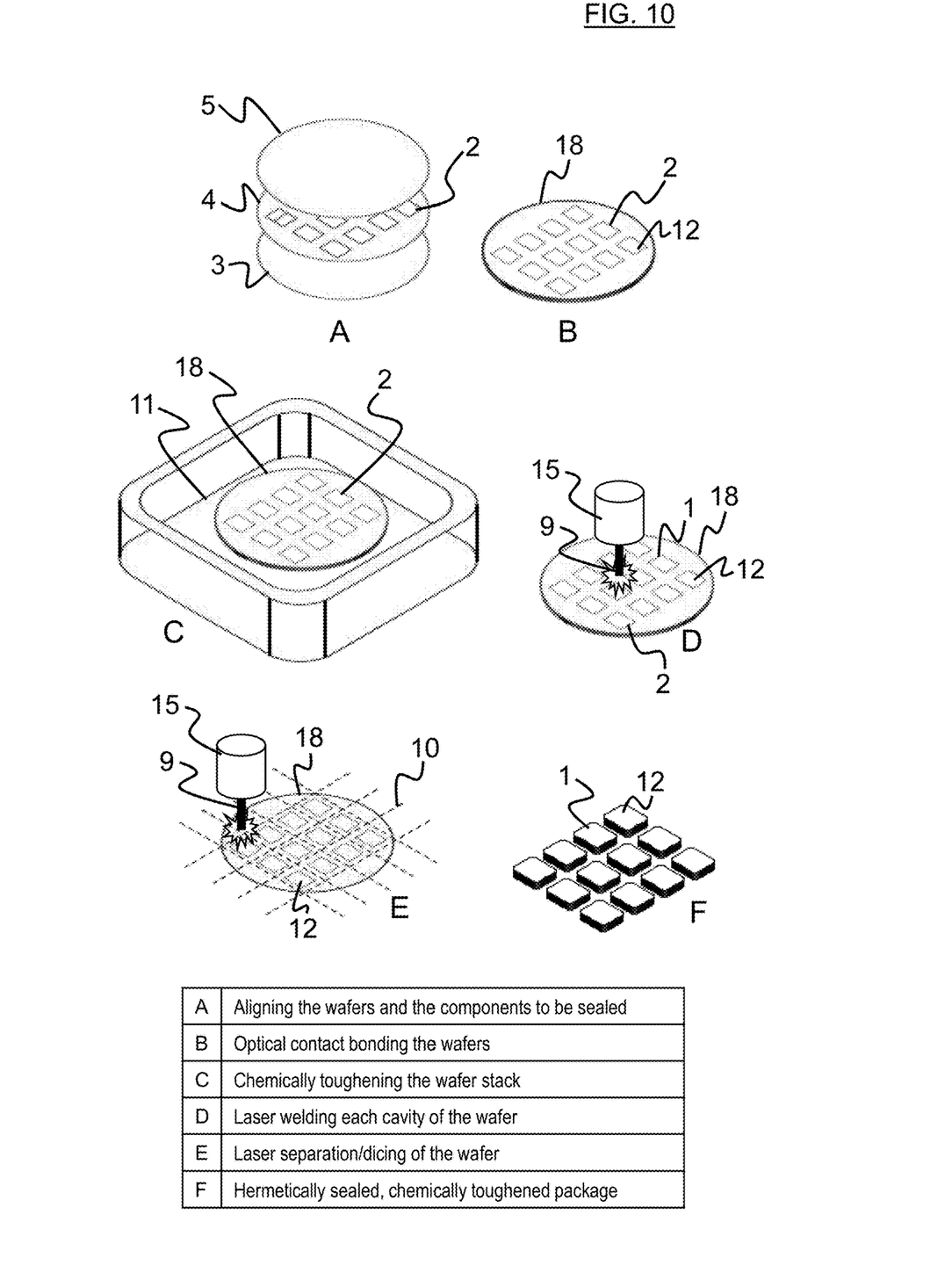
FIG. 10 illustrates method steps of a further method for producing the package.

Referring to FIG. 10 which shows a further method that can be used to obtain hermetically sealed, chemically toughened packages 1. In step A of the method, the wafer stack 18 is formed by arranging and aligning the individual wafer layers 3, 4, 5 one on top of the other. Accommodation items 2 are disposed in the accommodation cavities 12.

Step B shows the finished wafer stack 18 in which the lower wafer 3, intermediate wafer 4, and upper wafer 5 directly contact one another.

In step C, this wafer stack is fed to the bath 11 that includes acidic or basic toughening solution and is toughened in the bath.

In step D, the laser welding process is performed, in which each cavity 12 is hermetically sealed by welding together the three wafer layers 3, 4, 5. The laser joins the wafer layers 3, 4, 5 along the optical interfaces and around each individual cavity 12.

In step E, a laser cutting process is employed. The laser is guided along the cutting lines 10 such that the wafers can be effectively cut. This cutting process allows to obtain edges with particular strength. The edges may remain smooth and unfractured. However, edges with a finely ground-like roughness may also be obtained, for example when using short-pulse laser perforation.

Step F shows the so provided hermetically sealed and chemically toughened packages 1.

Figure 11:
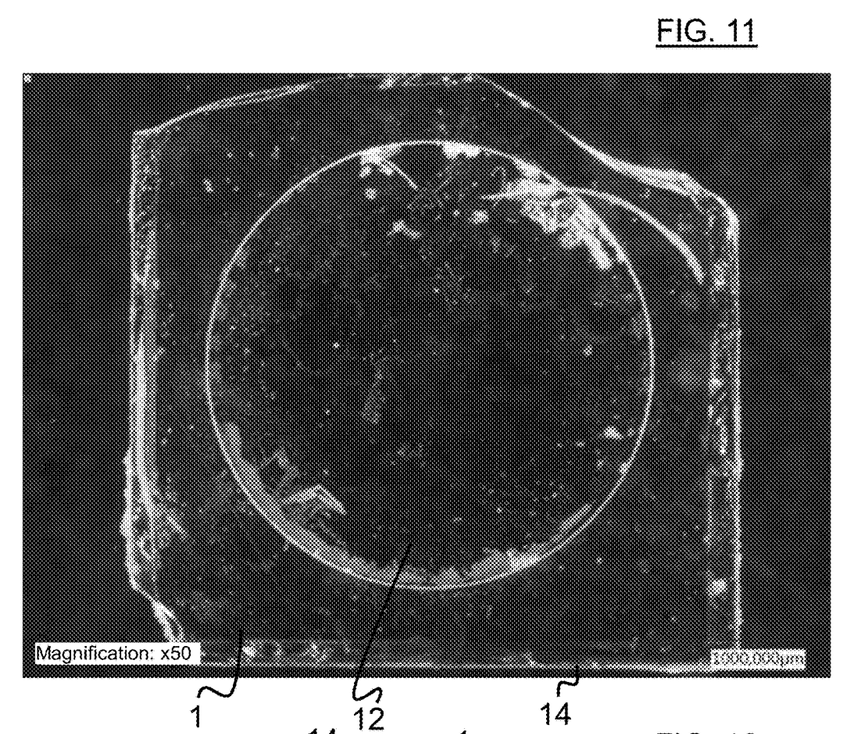
FIGS. 11-14 show micrographs of packages implemented according to the invention.

FIG. 11 shows a plan view of an example of an implemented toughened package 1 made of Schott D263T eco. The round, i.e. essentially circular cavity 12 can be clearly seen in the interior of package 1, sealed all around. In this example, the cavity 12 has a horizontal diameter of approximately 4 mm. The package has an edge length of about 5.5 mm. The illustrated sample was toughened in a 100% KNO$_3$ solution at 450° C. for 9 hours.

Figure 12:
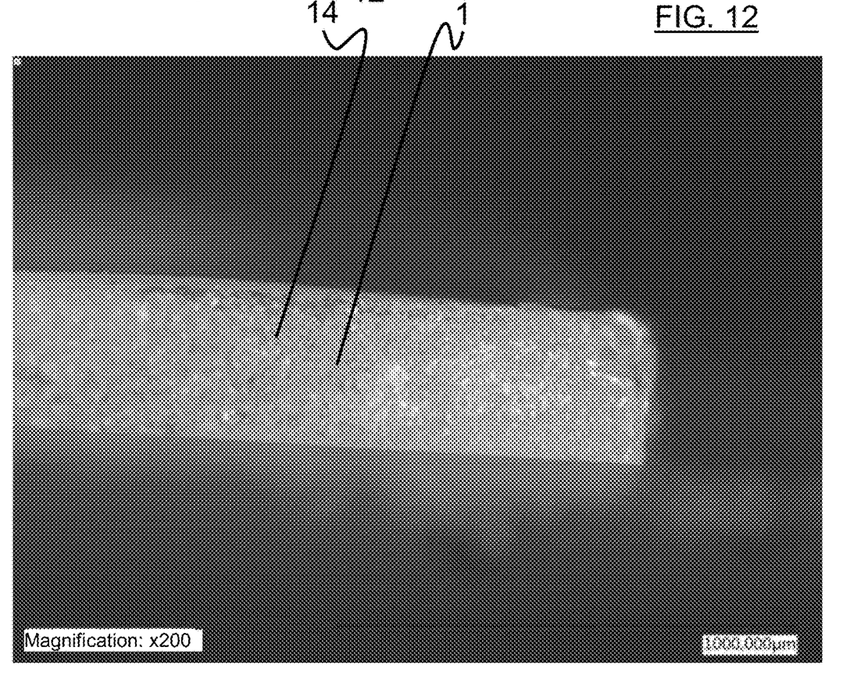
Figure 13:
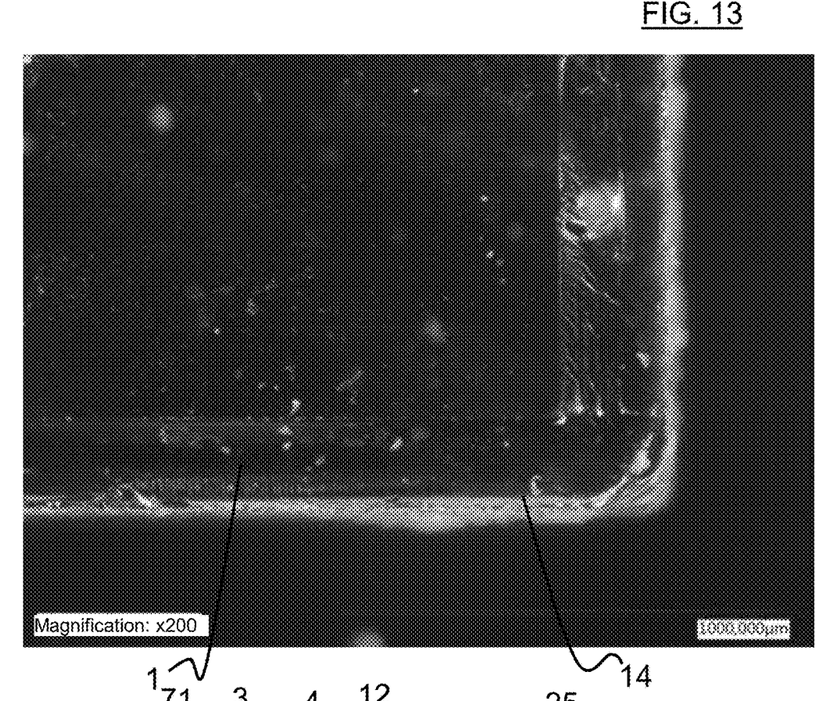

FIG. 12 shows a side view of the toughened edge 14 of a package 1 made of Schott D263T eco. For reasons of perspective, the cavity 12 is not visible in the view of FIG. 12. Referring to FIG. 13, a plan view of another package 1 is shown, in which the extension of the edge 14 can be seen.

Figure 14:
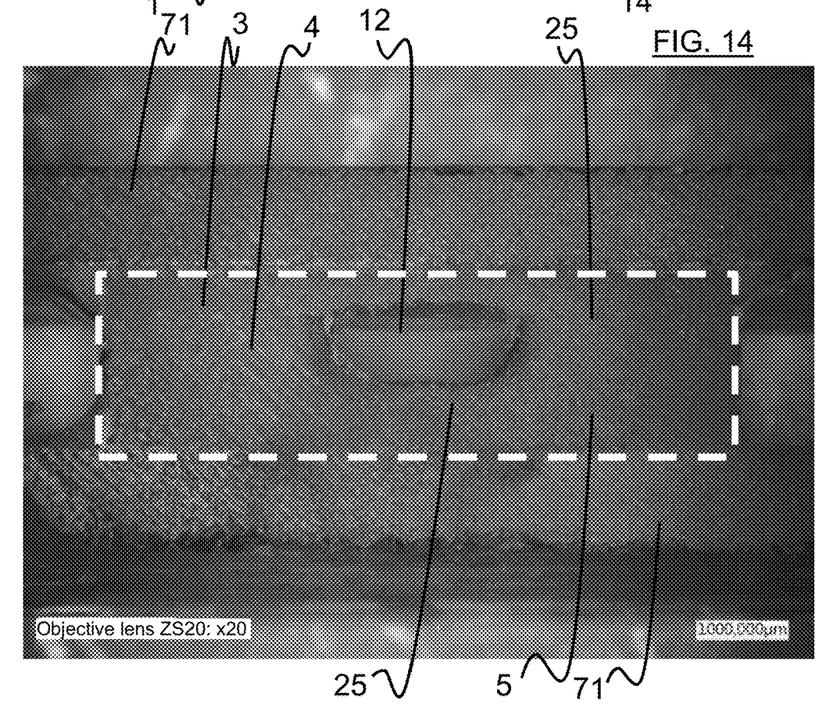

FIG. 14 finally shows a side view of a section through a package 1 provided according to the invention, made of Boro33, with a cavity 12 enclosed therein. The sample shown in FIG. 14 was also toughened for 9 hours at 450° C. in a 100% KNO$_3$ solution. FIG. 14 furthermore clearly shows the contact areas or interfaces 25 created between the substrate layers, which are provided between the lower substrate 3 and the intermediate layer 4 on the one hand and between the intermediate layer 4 and the upper substrate 5 on the other hand. The upper and lower squares are PMMA sheets that were glued to the glass chip in preparation of the cross-section. Only the framed area shows the glass package 1 in FIG. 14. Adjoining thereto is plastic as a remainder of sample preparation.

It will be apparent to a person skilled in the art that the embodiments described above are meant to be exemplary and that the invention is not limited thereto but may be varied in many ways without departing from the scope of the claims. Furthermore, it will be apparent that irrespective of whether disclosed in the description, the claims, the figures, or otherwise, the features individually define essential components of the invention, even if they are described together with other features. Throughout the figures, the same reference symbols designate the same pieces of subject-matter, so that a description of pieces of subject-matter that are possibly only mentioned in one or at least not in conjunction with all figures can also be transferred to such figures with regard to which the piece of subject-matter has not explicitly been described in the specification.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

LIST OF REFERENCE NUMERALS

1 Hermetically sealed, toughened package
2 Accommodation item
3 Lower substrate or base substrate or lower wafer
4 Intermediate substrate or intermediate wafer
5 Upper substrate or cover substrate or upper wafer
6 Corner of the laser-welded stack 18
7 Laser-welded interface zone
8 Laser welding zone
9 Focused laser beam
10 Separation or cutting lines
11 Bath with acidic or basic toughening solution
12 Accommodation cavity
13 Functional area
13a Second functional area
14 Edge
15 Laser unit for welding and/or cutting
16 Laser pulse impact area
18 Stack or wafer stack
21 Edge
22 Bottom of cavity
23 Upper side of cavity
25 Contact area or interface
27 Toughened zone or first toughened layer
28 Toughened zone or second toughened layer
29 Toughened zone or third toughened layer

What is claimed is:

1. A hermetically sealed package, comprising:
a base substrate and a cover substrate which define at least part of the package, the base substrate and the cover substrate being hermetically sealed to one another by at least one laser bonding line, the at least one laser bonding line having a height (HL) perpendicular to its bonding plane, at least the cover substrate comprising a toughened layer at its surface, at least on a side opposite the at least one laser bonding line, wherein the at least one laser bonding line includes mixed material from each of the joined substrates penetrating into the other one of the joined substrates; and
at least one functional area enclosed in the package.

2. The hermetically sealed package of claim 1, wherein at least one of the following is satisfied:
at least the cover substrate comprises a vitreous material;
the toughened layer is a chemically toughened layer; or the toughened layer exerts a compressive stress on the cover substrate.

3. The hermetically sealed package of claim 1, wherein at least one of the following is satisfied:
the base substrate and the cover substrate are hermetically sealed to one another by one and the same laser bonding line; or
the at least one laser bonding line circumferentially encloses the at least one functional area at a distance therefrom.

4. The hermetically sealed package of claim 1, wherein the toughened layer has a depth of layer (DoL) and the cover substrate has a minimum material thickness (MM) above the at least one laser bonding line up to the toughened layer, wherein, with a total thickness (DA) of the cover substrate, the following holds true: DA−HL−DoL≥MM.

5. The hermetically sealed package of claim 1, wherein the cover substrate is toughened on both sides thereof, so that the cover substrate has a second toughened layer with a depth of layer (DoLb) at an interface to the base substrate.

6. The hermetically sealed package of claim 5, wherein the height HL of the at least one laser bonding line is greater than the depth of layer DoLb of the second toughened layer.

7. The hermetically sealed package of claim 5, wherein at least the cover substrate comprises a toughened layer on all of its sides so the at least one cover substrate has the toughened layer, the second toughened layer, and a third toughened layer, with the toughened layer having a depth of layer (DoLa), the second toughened layer having the depth of layer DoLb, and the third toughened layer having a depth of layer (DoLc) along a circumferential edge of the package, wherein DoLa, DoLb, and DoLc have the same thickness.

8. The hermetically sealed package of claim 1, wherein the cover substrate comprises the at least one functional area or a further functional area.

9. The hermetically sealed package of claim 1, wherein the base substrate has a toughened layer on its lower surface opposite the at least one laser bonding line.

10. The hermetically sealed package of claim 1, further comprising an intermediate substrate disposed between the base substrate and the cover substrate, wherein the base substrate is bonded to the intermediate substrate in a bonding plane, and wherein the cover substrate is bonded to the intermediate substrate in a second bonding plane.

11. The hermetically sealed package of claim 10, wherein the at least one functional area comprises a hermetically sealed accommodation cavity for receiving an accommodation item.

12. The hermetically sealed package of claim 11, wherein the cover substrate defines an upper side of the accommodation cavity, the intermediate substrate defines a lateral circumferential edge of the accommodation cavity, and the base substrate defines a bottom of the accommodation cavity, which together completely enclose the accommodation cavity; and wherein at least one of the lateral circumferential edge, the bottom, or the upper side is transparent for a range of wavelengths, at least in sections thereof.

13. The hermetically sealed package of claim 1, wherein the package is bonded to form the hermetically sealed package by a laser welding process, by having at least one laser bonding line that joins together the base substrate, and the cover substrate.

14. The hermetically sealed package of claim 1, wherein at least one of the following is satisfied:
the package is toughened on all sides of the at least one functional area; or
the package has a toughened layer at each of its outer surfaces.

15. The hermetically sealed package of claim 1, wherein toughening of the package is achieved by partially or completely exchanging sodium ions by potassium ions over a layer thickness of 30 μm or less.

16. A method for providing a plurality of hermetically sealed packages, each package providing a functional area, the method comprising:
providing at least two substrates, the at least two substrates comprising a cover substrate and a base substrate, wherein at least the cover substrate comprises transparent material at least in sections thereof, wherein the at least two substrates are arranged so as to directly adjoin or be on top of one another;
hermetically sealing the functional area by bonding the at least two substrates to one another along a bonding line by a laser welding process;
dicing a respective package by cutting or separation; and
chemically toughening a surface of a respective package by bathing it in a chemical solution.

17. The method of claim 16, wherein the at least two substrates are provided in the form of a wafer stack comprising at least two wafers for jointly producing a plurality of hermetically sealed packages from the wafers in one and the same fabrication process.

18. The method of claim 17, wherein the at least two wafers are made of a material selected from the group consisting of glass, glass ceramics, silicon, and sapphire or wherein at least one wafer comprises a different material than another one of the at least two wafers.

19. The method claim 16, wherein the dicing of a respective package is performed by laser cutting or laser separation.

20. The method of claim 16, wherein at least one of the at least two substrates is a transparent substrate and the at least one transparent substrate is made of a material selected from the group consisting of glass, glass ceramics, silicon, sapphire, and a combination of the aforementioned materials.

21. The method of claim 16, wherein the chemical toughening of the packages comprises at least one of the following:
providing an acidic or basic solution;
introducing the packages into the acidic or basic solution;
heating the acidic or basic solution to a temperature of at least 650 Kelvin;
bathing the packages in the acidic or basic solution for at least 6 hours.

* * * * *